(12) United States Patent
Cho et al.

(10) Patent No.: US 7,889,485 B2
(45) Date of Patent: Feb. 15, 2011

(54) DISPLAY DEVICE MODULE AND METHOD OF HANDLING THE SAME

(75) Inventors: Jin-Ho Cho, Cheonan-si (KR); Chul-Woo Lee, Asan-si (KR); Young-Jae Lee, Yongin-si (KR); Byung-Cheon Yoo, Chungcheongbuk-do (KR); Jae-Woo Jang, Suwon-si (KR); Nam-Sik Ko, Asan-si (KR); Kyung-Deuk Park, Asan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 164 days.

(21) Appl. No.: 12/260,663

(22) Filed: Oct. 29, 2008

(65) Prior Publication Data

US 2009/0116179 A1    May 7, 2009

(30) Foreign Application Priority Data

Nov. 7, 2007    (KR) .................... 10-2007-0113148

(51) Int. Cl.
   *G06F 1/16*    (2006.01)

(52) U.S. Cl. .................. 361/679.21; 362/199; 345/175; 248/460; 349/61

(58) Field of Classification Search ................. 362/611, 362/632, 97.1, 28, 199, 613; 422/58; 706/45; 361/679.05, 679.06, 679.21, 679.27, 679.29, 361/679.22; 345/158, 204, 174, 175, 60, 345/87; 313/479, 112, 582, 504; 174/388, 174/393; 349/157, 58, 61; 248/205.3, 460, 248/371

See application file for complete search history.

(56) References Cited

U.S. PATENT DOCUMENTS

| 2004/0156747 A1* | 8/2004 | Jochumsen et al. ............ 422/58 |
| 2008/0151573 A1* | 6/2008 | Kim et al. .................... 362/611 |
| 2009/0177603 A1* | 7/2009 | Honisch ....................... 706/45 |

* cited by examiner

*Primary Examiner*—Hung V Duong
(74) *Attorney, Agent, or Firm*—F. Chau & Associates, LLC

(57) ABSTRACT

A display device module includes a display panel having a first side and a second side, a first receiving container having a first side and a second side, the first side receiving the first side of the display panel, and a grip protrusion formed on the second side of the first receiving container for engaging a jaw of a gripper.

17 Claims, 9 Drawing Sheets

DISPLAY DEVICE MODULE AND METHOD OF HANDLING THE SAME

CROSS-REFERENCE TO RELATED APPLICATION

This application claims priority to Korean Patent Application No. 10-2007-0113148 filed on Nov. 7, 2007, the disclosure of which is incorporated herein by reference in its entirety.

BACKGROUND OF THE INVENTION

1. Technical Field

The present disclosure relates to a display device module and a method of handling the same, and more particularly to a display device module having a protrusion and a method of handling the display device module using the protrusion.

2. Discussion of Related Art

A flat panel display device includes, for example, a liquid crystal display device, a plasma display device, and an organic light emitting diode display device. A bezel with a narrow width is used to reduce a size of a display device module in the flat panel display device.

The display device module can be assembled by an automated system. In the automated system, the display device module can be moved by a gripper of an automatic robot. A conventional display device module includes an upper receiving container, and a lower receiving container with recesses concavely formed toward the upper receiving container. A jaw of the gripper is hooked at the recesses of the lower receiving container to move the display device module.

However, when the width of the bezel of the display device module is narrow, a space to form the recesses is limited. As a result, the gripper has difficulty supporting a heavy display device module in an automatic assembling process for the display device module.

SUMMARY OF THE INVENTION

Embodiments of the present invention provide a display device module that can be safely handled by an automated system, and a handling method of the same.

According to an exemplary embodiment of the present invention, a display device module comprises a display panel having a first side and a second side, a first receiving container having a first side and a second side, the first side receiving the first side of the display panel, and a grip protrusion formed on the second side of the first receiving container for engaging a jaw of a gripper.

The gripper can be installed at a transferring unit to grip and move the first receiving container.

The display device module may further comprise a second receiving container receiving the second side of the display panel.

The display device module may further comprise at least another grip protrusion formed on the second side of the first receiving container.

A plurality of grip protrusion can be arranged continuously in a row on the second side of the first receiving container.

The grip protrusion can be formed across substantially all or all of a width of the second side of the first receiving container.

The grip protrusion can be formed by bending a portion of the second side of the first receiving container.

A lower portion of the grip protrusion can be open.

The grip protrusion can be angled with respect to the second side of the first receiving container.

The display device module may further comprise a grip block coupled to the second side of the first receiving container by a connection member, the grip block comprising a guide hole and a first connection hole.

The display device module may further comprise a guider and a second connection hole formed on the second side of the first receiving container, wherein the guide hole receives the guider to line up the first connection hole, the first and second connection holes receiving the connection member to fix the grip block to the first receiving container.

The grip block may comprise an uneven portion at a lower portion thereof.

According to an exemplary embodiment of the present invention, a method of handling a display device module comprises engaging the display device module using a jaw of a gripper, wherein the jaw engages a grip protrusion formed on an outer surface of a receiving container of the display device module, and lifting the display device module, and transporting the display device module.

The gripper further may comprise a plate formed opposite the jaw, and the method further comprises supporting the display device module at surface opposite the outer surface of the receiving container by using the plate.

The gripper may further comprise a vacuum suction unit, and the method further comprises supporting the display device module using the vacuum suction unit.

The method may further comprise transporting the display device module by grabbing the grip protrusion with a hand of a user.

According to an exemplary embodiment of the present invention, a display device module comprises an upper receiving container having a bezel, a lower receiving container having a first surface and a second surface, wherein the first surface of the lower receiving container and the bezel of the upper receiving container receive a display panel therebetween, wherein the second surface of the lower receiving container includes at least one grip protrusion for engaging a gripper.

BRIEF DESCRIPTION OF THE DRAWINGS

Exemplary embodiments of the present invention can be understood in more detail from the following descriptions taken in conjunction with the accompanying drawings, in which.

DESCRIPTION OF EXEMPLARY EMBODIMENTS

The invention is described more fully hereinafter with reference to the accompanying drawings, in which embodiments of the invention are shown. This invention may, however, be embodied in many different forms and should not be construed as limited to the embodiments set for the herein.

Figure 1:
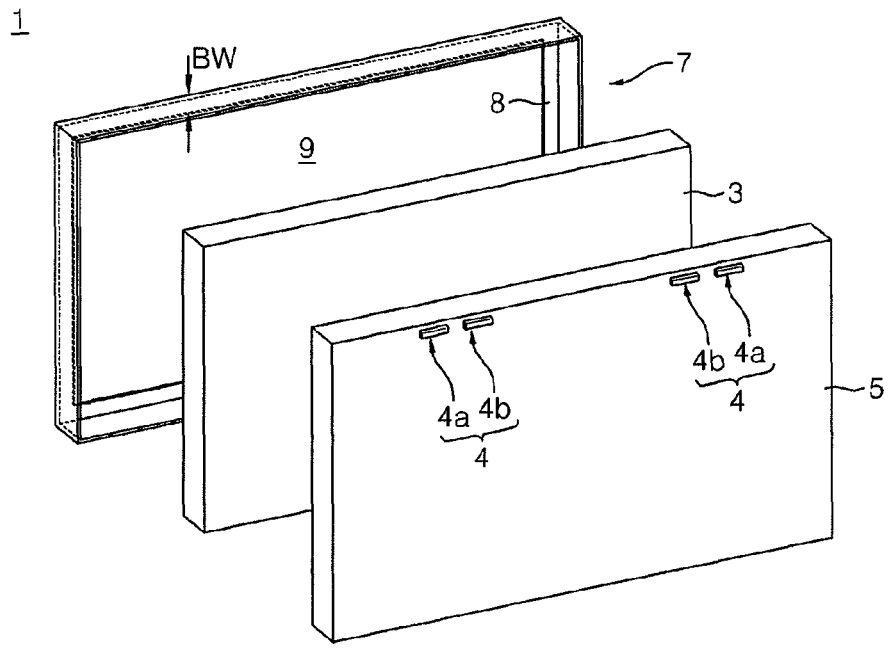
FIG. 1 is an exploded perspective view showing a display device module according to an exemplary embodiment of the present invention.

FIG. 1 is an exploded perspective view showing a display device module according to an exemplary embodiment of the present invention.

Referring to FIG. 1, a display device module 1 includes a display panel 3, a lower receiving container 5 to receive the display panel 3, and an upper receiving container 7 facing the lower receiving container 5.

The lower receiving container 5 is combined to the upper receiving container 7 to receive the display panel 3. The upper receiving container 7 includes a bezel 8 with an opening 9 exposing the display panel 3.

A control circuit substrate (not shown) and an inverter circuit substrate may be provided on a rear surface of the lower receiving container 5. The lower receiving container 5 may include materials with high strength, such as, for example, metals to protect the display panel 3.

A large sized display device module has a bezel with a narrow width to reduce a size of the display device module. When the width BW of the bezel 8 is large enough, recesses concavely formed toward the upper receiving container 7 may be formed in the lower receiving container 5. The recesses may be used to move the display device module 1, since space of an upper side of the display panel 3 and space of an upper side of the lower receiving container 5 are increased.

In an exemplary embodiment of the present invention, the lower receiving container 5 includes a grip protrusion 4 bended toward the outside of the lower receiving container 5. Accordingly, the display device module 1 does not need space for forming the recesses near the upper side of the lower receiving container 5.

The grip protrusion 4 may be formed at the upper side or the lower side of the lower receiving container 5.

In an embodiment, the grip protrusion 4 may be formed at the upper side of the lower receiving container 5 for easy handling of the display device module 1. The grip protrusion 4 may be formed at the both upper and lower sides of the lower receiving container 5 to support the display device module 1.

Figure 7A:
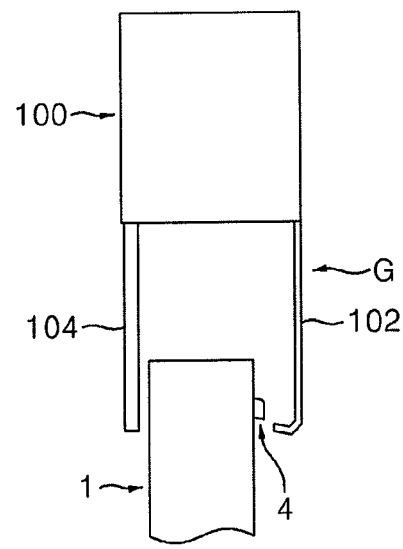
FIG. 7A to FIG. 7C are views showing a gripper according to an exemplary embodiment of the present invention.
Figure 7B:
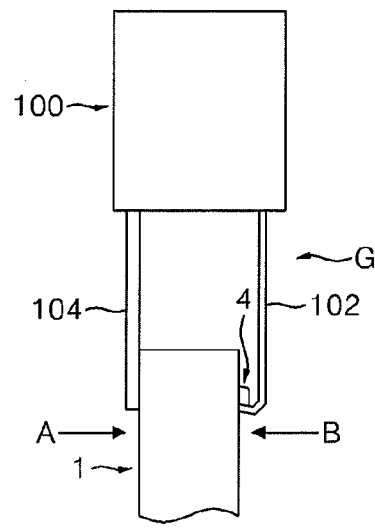
Figure 7C:
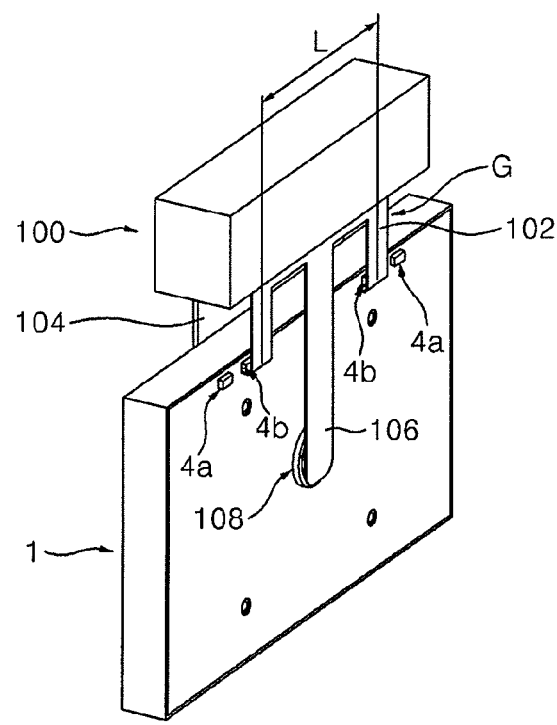

Referring to FIGS. 7A to 7C, a transfer unit 100 is installed in an automated production system to move the display device module 1. The transferring unit 100 has a gripper G. The transfer unit 100 may transfer the display device module 1 using the gripper G. For example, the display device module 1 moves in an upright position.

The gripper G with various sizes may be used to handle the display device with various sizes.

A plurality of grip protrusions 4 may be formed in the lower receiving container 5 to support the display device module 1. A plurality of grip protrusion sets 4a, 4b may be formed in the lower receiving container 5 to correspond to the gripper G with various sizes. The grip protrusion sets may be more than two sets.

The display device module 1 may further include an outer case (not shown) to receive the lower and upper receiving containers 5 and 7. The outer case may include a rear case combined with the lower receiving container 5 and a front case having an opening to expose the display panel 3 and to be combined with the upper receiving container 7.

Exemplary embodiments of the present invention may be applied to various display panels, such as, for example, liquid crystal panels, plasma display panels, and organic light emitting diode display panels.

Figure 2:
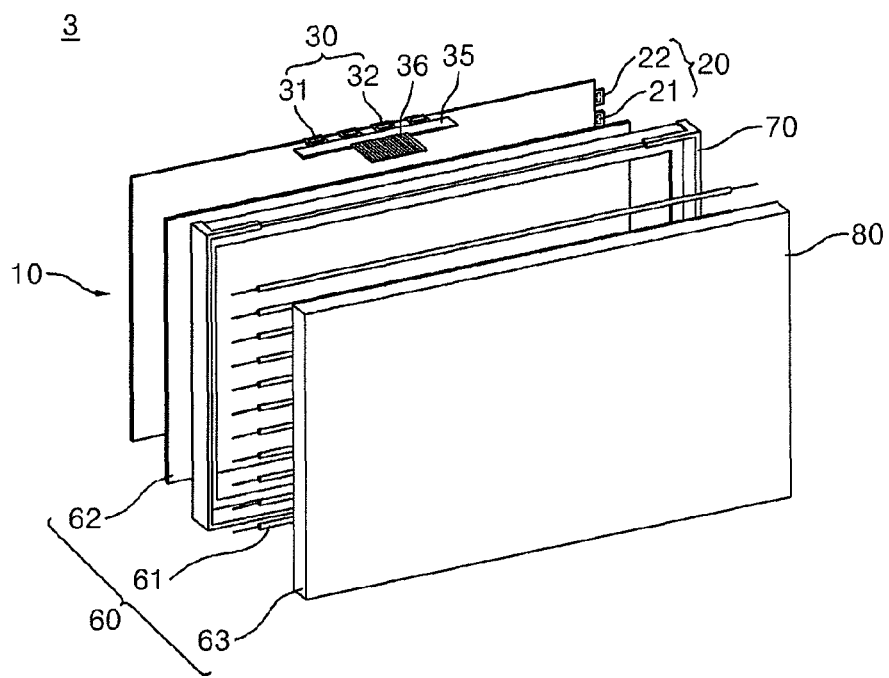
FIG. 2 is an exploded-perspective view showing a display panel according to an exemplary embodiment of the present invention.

FIG. 2 is an exploded-perspective view showing a display panel according to an exemplary embodiment of the present invention.

Referring to FIG. 2, a liquid crystal display panel 3 includes a liquid crystal panel 10, a gate driver 20, a date driver 30, and a backlight unit 60.

The liquid crystal panel 10 includes a thin film transistor substrate and a color filter substrate with liquid crystals interposed therebetween. The thin film transistor substrate and the color filter substrate are bonded to each other.

The gate driver 20 includes a gate integrated circuit 21 mounted on the gate tape carrier package 22. The gate driver 20 may be connected to a side of the liquid crystal panel 10.

The data driver 30 includes a data integrated circuit 31 mounted on the data tape carrier package 32. A first side of the data driver 3 may be connected to the liquid crystal panel 10 and a second side of the data driver 3 may be connected to a data circuit substrate 35.

A first side of the data circuit substrate 35 may be electrically connected to the data driver 30 and a second side of the data circuit substrate 35 may be electrically connected to a control circuit substrate (not shown) via a signal transferring film 36. The signal transferring film 36 may be arranged on a rear surface of the data circuit substrate 35 and inserted into a connector (not shown) of the control circuit substrate disposed at the outside of the lower receiving container 5 through the lower receiving container 5.

The signal transferring film 36 may include a signal transferring line and a connection pad comprising a metallic thin film, formed on a base film and connected to each other. Alternatively, the signal transferring film 36 may be a flexible printed circuit film comprising sequentially stacked protective films.

The gate driver 20 and the data driver 30 may be formed on the liquid crystal panel 10, for example, as an amorphous silicon gate type. The liquid crystal panel 10 and the backlight unit 60 are received in the lower receiving container 5. The backlight unit 60 includes at least one light source 61, an optical sheet(s) 62, and a reflective sheet(s) 63.

The light source 61 may be, for example, a cold cathode fluorescent lamp, an external electrode fluorescent lamp, and a light emitting diode module. A plurality of light sources 61 are arranged behind the liquid crystal panel 10 to supply light to the liquid crystal panel 10. The light source 61 may be arranged at a side of the liquid crystal panel 10 as an edge type backlight unit to supply the light to the liquid crystal panel 10 through a light guide plate (not shown).

The optical sheet 62 may be arranged between the liquid crystal panel 10 and the light source 61 in a plate type to improve efficiency and uniformity of the light supplied from the light source 61. The optical sheet 62 may include, for example, a diffusion sheet, a prism sheet, and a protective sheet.

The reflective sheet 63 is arranged between the light source 61 and the lower receiving container 5 to reflect the light radiated to the lower receiving container 5 toward the liquid crystal panel 10.

An exemplary embodiment of the present invention may further include a mold frame 70 to receive the liquid crystal panel 10. The mold frame 70 may also receive the optical sheet 62.

The mold frame 70 receiving the liquid crystal panel 10 and the optical sheet 62 may be received in the lower receiving container 5.

Figure 3A:
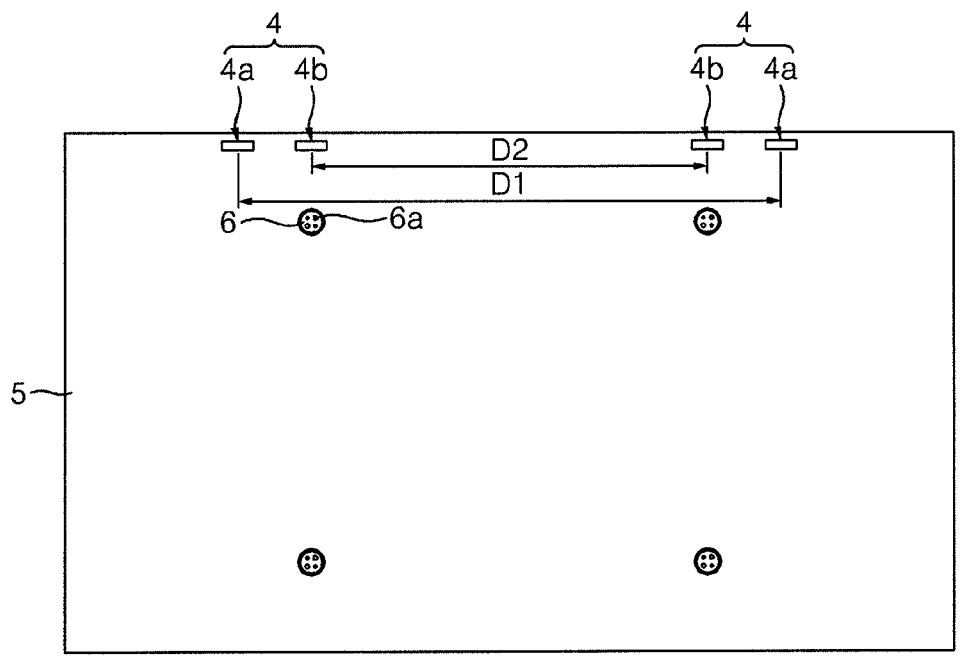
FIG. 3A is a view showing a display device module according to an exemplary embodiment of the present invention.

FIG. 3A is a view showing a display device module according to an exemplary embodiment of the present invention.

Referring to FIG. 3A, the grip protrusion 4 may be formed in the lower receiving container 5. The grip protrusion 4 is formed at the upper side of the rear surface of the lower receiving container 5, and protruded from the lower receiving container 5 to the outside of the lower receiving container 5.

In an exemplary embodiment, a plurality of protrusions 6 with connecting holes 6a may be formed at the rear surface of the lower receiving container 5 to combine the control circuit substrate to an outer case.

A jaw of a transferring unit is hooked at the grip protrusion 4. Referring to FIG. 1 and FIGS. 7A-7C, the display device module 1 is supported by the grip protrusion 4 at the portion where the jaw is hooked.

The jaw of the gripper G is hooked at a pair of protrusions 4 ("grip protrusion set") to support the display device module 1.

A plurality of grip protrusion sets may be formed at the rear surface of the lower receiving container 5 to correspond to grippers with various sizes. For example, a first grip protrusion set 4a with a first distance D1 between the grip protrusions and a second grip protrusion set 4b with a second distance D2 between the grip protrusions may be formed at the rear surface of the lower receiving container 5.

When using the gripper G with narrow distance between the jaws, the jaws may be hooked at the second grip protrusion set 4b. When using the gripper G with wide distance between the jaws, the jaws may be hooked at the first grip protrusion set 4a.

Figure 3B:
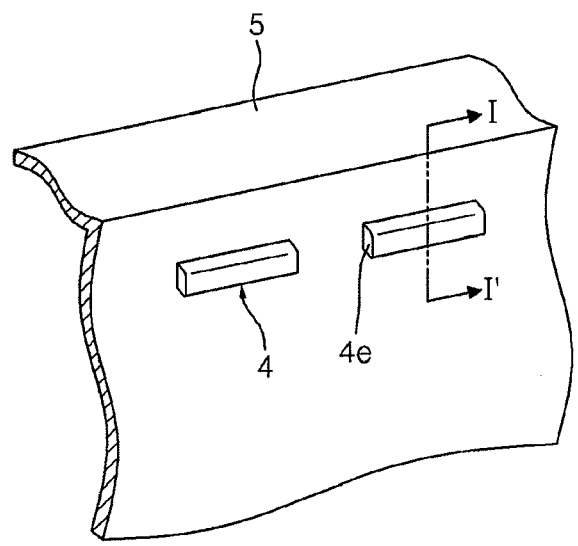
FIG. 3B is an enlarged view showing a grip protrusion of a display module according to an exemplary embodiment of the present invention.
Figure 3C:
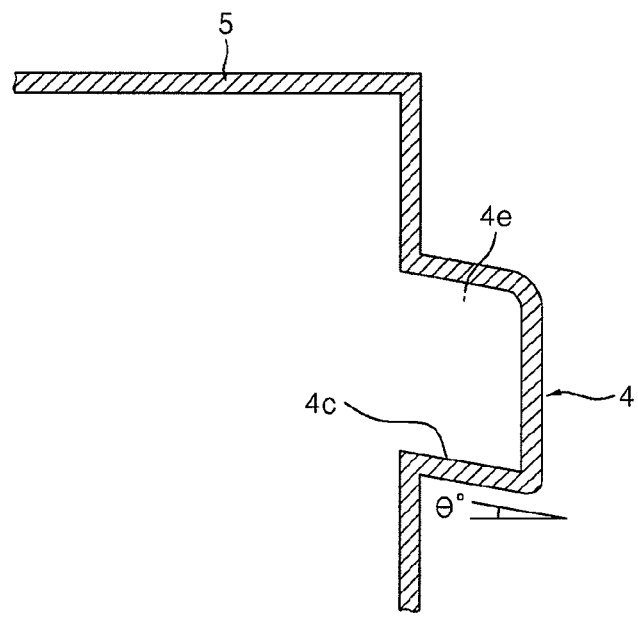
FIG. 3C and FIG. 3D are cross-sectional views showing a grip protrusion taken along the line I-I' of FIG. 3B.
Figure 3D:
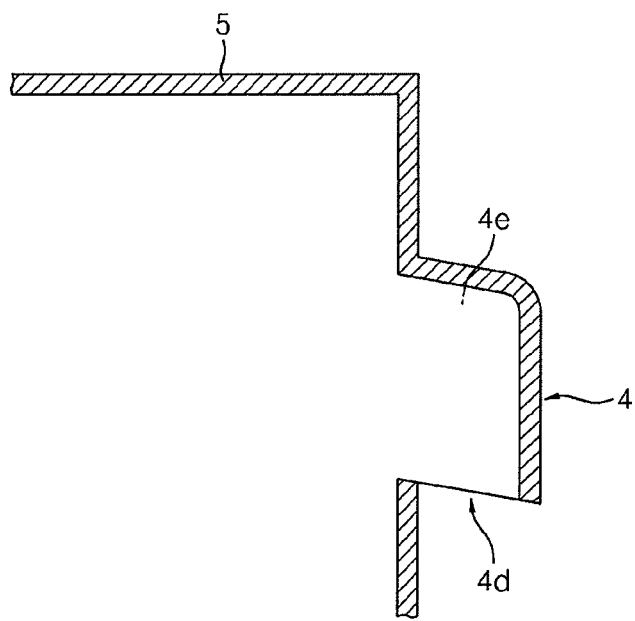

FIG. 3B is an enlarged view showing a grip protrusion of a display module according to an exemplary embodiment of the present invention. FIG. 3C and FIG. 3D are cross-sectional views showing a grip protrusion taken along the line I-I' of FIG. 3B.

Referring to FIG. 3B and FIG. 3C, the grip protrusion 4 may be formed by bending a portion of the rear surface of the lower receiving container 5 toward the outside of the lower receiving container 5. A lower portion 4c of the grip protrusion 4 is inclined with respect to the upper side of the lower receiving container 5. As the lower portion 4c of the grip protrusion 4 has a predetermined tilt angle θ°, the jaw of the gripper can be hooked at the grip protrusion 4.

Referring to FIG. 3D, an opening portion 4d may be formed at the lower portion of the grip protrusion 4. In an exemplary embodiment, lateral sides 4e of the grip protrusion 4 may be closed or opened.

When the lateral sides 4e of the grip protrusion 4 are closed, a lower portion of the lateral sides 4e of the grip protrusion 4 may have the tilt angle θ° as shown in FIG. 3C.

Figure 4A:
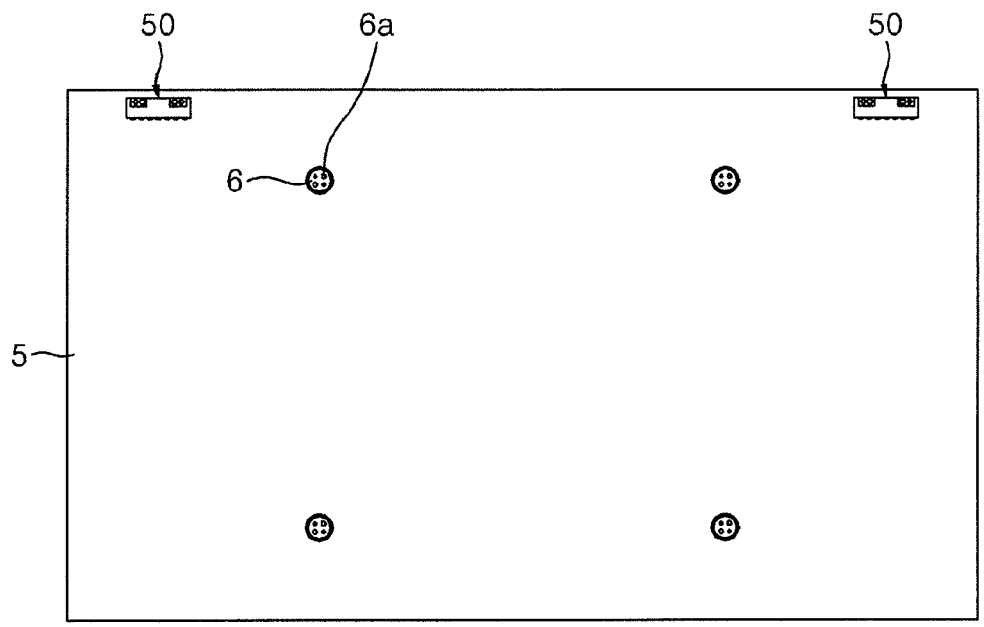
FIG. 4A is a view showing a display device module according an exemplary embodiment of the present invention.
Figure 4B:
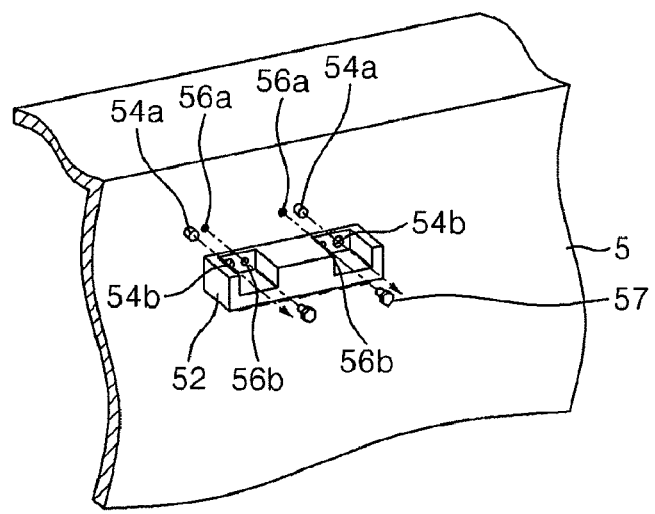
FIG. 4B is an exploded-perspective view showing a grip protrusion according to an exemplary of the present invention.
Figure 4C:
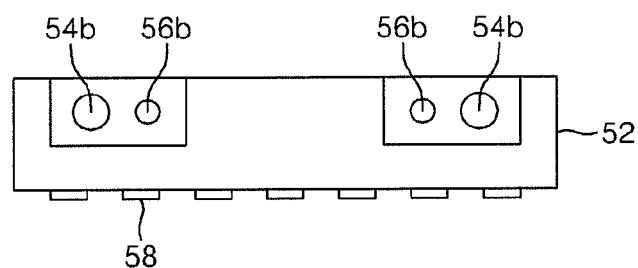
FIG. 4C is a front view of a grip protrusion according to an exemplary embodiment of the present invention.

FIG. 4A is a view showing a display device according an exemplary embodiment of the present invention. FIG. 4B is an exploded-perspective view showing a grip protrusion according to an exemplary embodiment of the present invention. FIG. 4C is a front view showing a grip protrusion according to an exemplary embodiment of the present invention.

Referring to FIG. 4A, a display device module 1 includes a grip protrusion 50 connected to the lower receiving container 5. The grip protrusion 50 may be connected to an upper portion of the rear surface of the lower receiving container 5 and may be connected to both sides of the lower receiving container 5.

Referring to FIG. 4B, the grip protrusion 50 includes a guider 54a formed on the rear surface of the lower receiving container 5 and a grip block 52 connected to the lower receiving container 5 by a connection member 57.

A first connection hole 56a may be formed adjacent the guider 54a to receive the connection member 57. The connection member 57 can be, for example, a screw or a rivet.

The grip block 52 may include a guide hole 54b corresponding to the guider 54a and a second connection hole 56b corresponding to the first connection hole 56a.

The guider 54a may be inserted into the guide hole 54b to connect the grip block 52 to the lower receiving container 5. The grip block 52 may be installed by the connection member 57 inserted into the first and the second connection holes 56a and 56b.

Referring to FIG. 4C, an uneven portion 58 may be formed at the lower portion of the grip block 52. The uneven portion 58 is formed within a user's reach to prevent the user from dropping the grip block 52 during manual processes. A lower surface of the grip block 52 may be inclined with respect to the upper portion of the lower receiving container 5 similar to the grip protrusion 4 of FIG. 3C.

The grip protrusion 50 may be hooked at the jaw of the gripper G in an automated processes and the grip protrusion 50 may be used during the manual processes.

The grip block 52 is connected to the upper portion of the rear surface of the lower receiving container 5. An assembling apparatus may interfere with an outer case when the grip block 52 is positioned too close to the upper edge of the lower receiving container 5. It is difficult to grip the grip block 52 or to support the display device module 1 when the grip block 52 is positioned too far from the upper edge of the lower receiving container 5.

Figure 5:
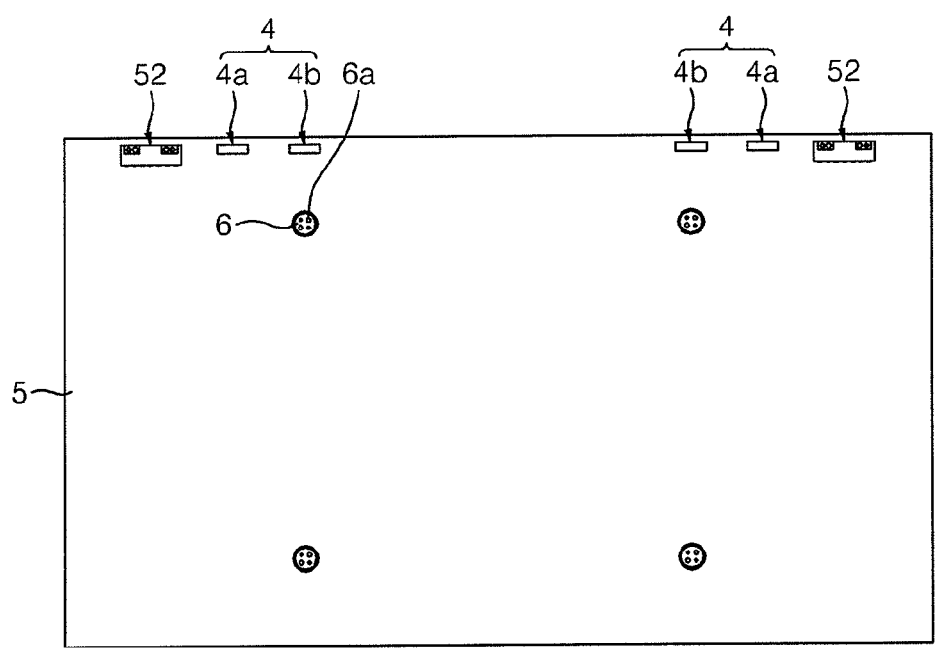
FIG. 5 is a plan view showing a display device module according to an exemplary embodiment of the present invention.

FIG. 5 is a plan view showing a display device according to an exemplary embodiment of the present invention.

Referring to FIG. 5, a display device module includes the first grip protrusion 4 of FIG. 1A to FIG. 3C and the second grip protrusion 50 of FIG. 4A to FIG. 4C.

The jaw of the gripper G may be hooked at the first grip protrusion 4 or the second grip protrusion 50 in the automated processes. Referring to FIG. 1 and FIGS. 7A-7C, the user grips the second grip protrusion 50 to transfer the display device module 1.

Figure 6:
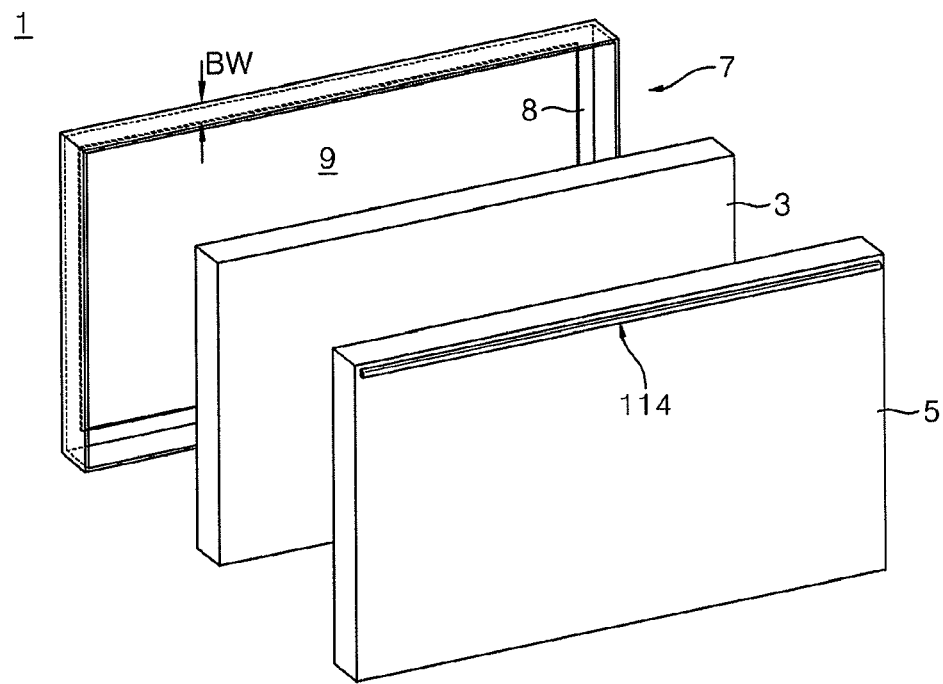
FIG. 6 is a perspective view showing a display device module according to an exemplary embodiment of the present invention.

FIG. 6 is a perspective view showing a display device module according to an exemplary embodiment of the present invention.

Referring to FIG. 6, the lower receiving container 5 includes a grip protrusion 114 bended from a portion of the lower receiving container 5 to the outside of the lower receiving container 5. The grip protrusion 114 may be formed at one of the upper portion and the lower portion of the lower receiving container 5. The grip protrusion 114 may be formed in a line shape extended from one side of the lower receiving container 5 to another side of the lower receiving container 5.

In an embodiment, a plurality of grip protrusions 114 may be arranged in a row. The grip protrusion 114 may be formed at a predetermined distance from left and right edges of the rear surface of the lower receiving container 5. Alternatively, the grip protrusion 114 may be formed across the rear surface of the lower receiving container 5 without a distance from the left and right edges of the rear surface of the lower receiving container 5.

FIG. 7A to FIG. 7C are views showing a gripper according to an exemplary embodiment of the present invention.

Referring to FIG. 7A and FIG. 7B, the transferring unit 100 may include the gripper G including a jaw 102 and a plate 104. The gripper G grips a front surface and a rear surface of the display device module 1 using the jaw 102 and the plate 104.

The transferring unit 100 is moved to an upper portion of the display device module 1 and descended from the upper portion of the display device module 1 to a predetermined position where the jaw 102 and the plate 104 of the gripper G are opposed to each other near the grip protrusion 4 as shown in FIG. 7A.

After alignment of the grip protrusion 4, the jaw 102 and the plate 104 are moved toward each other (in directions A and B), so that the jaw 102 of the gripper G is hooked at the lower portion the grip protrusion 4 and the front surface of the display device module 1 is supported by the plate 104 of the gripper G as shown in FIG. 7B.

Referring FIG. 7C, the gripper G may include a pair of jaws 102 with a predetermined distance L between the jaws 102. The plate 104 may be oppositely installed to a pair of jaws 102.

The gripper G may include a vacuum suction unit 108 to further support the display device module 1. The front surface or the rear surface of the display device module 1 may be supported by vacuum pressure of the vacuum suction unit 108. For example, the vacuum suction unit 108 may be disposed at a supporter 106 arranged between a pair of jaws 102 to be contacted to the rear surface of the lower receiving container 5, thereby supporting the display device module 1.

The jaw 102 is hooked at the first grip protrusion 4a or the second grip protrusion 4b of the display device module 1 to support weight of the display device module 1. The display device module 1 is supported by the plate 104 positioned opposite the jaw 102, so that the display device module 1 is supported.

The vacuum suction unit 108 may grab the front surface or the rear surface of the display device module 1 to implement an auxiliary function of the jaw 102 and the plate 104.

Figure 8:
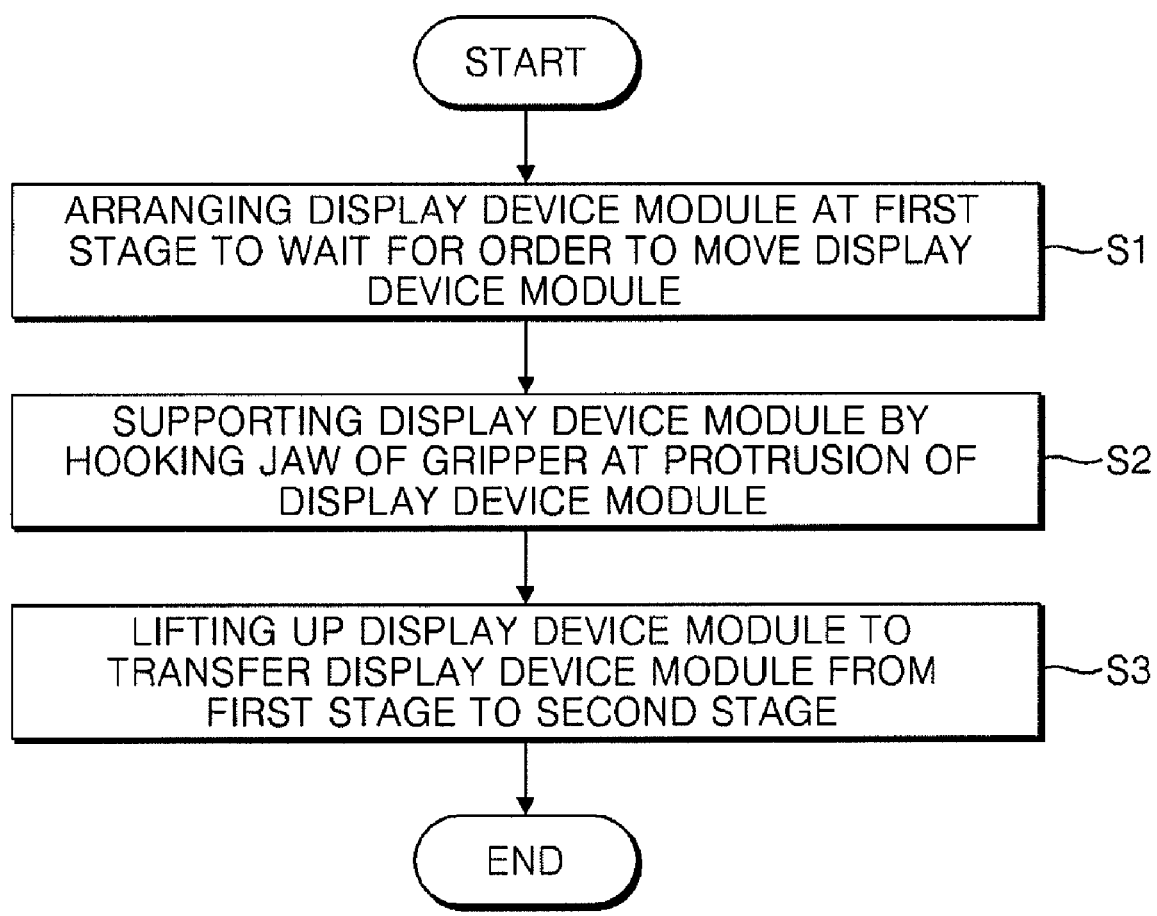
FIG. 8 is a flow chart showing a method of handling a display device module according to an exemplary embodiment of the present invention.

FIG. 8 is a flow chart showing a method of handling a display device according to an exemplary embodiment of the present invention.

Referring to FIG. 8, a handling method includes arranging the display device module 1 at a first stage in a production system or an assembling system with automated equipment to wait for an instruction to move the display device module 1 (step of S1).

In the first stage, an assembling process, an inspecting process, and a packaging process of the display device module can be performed. The display device module 1 may be moved by the transferring unit, such as an automated robot in a corresponding sector or the next sector of the production line for a next working process.

In the next step, the display module 1 is supported by hooking the jaw 102 of the gripper G of the transferring unit 100 at the protrusion 4 or 50 of the display device module 1. (step of S2).

The gripper G may include the jaw 102 and the plate 104. The jaw 102 may be hooked at the grip protrusion formed on a first side, such as the rear surface of the display device module 1, and the plate 104 may contact a second side, such as the front surface of the display device module 1 to support the display device module 1. The gripper G may further include the vacuum suction unit 108 to further support the display device module 1.

In the next step, the display device module 1 is lifted and is transferred from the first stage to a second stage (step of S3).

The display device module 1 may be supported by the jaw 102, the plate 104, and the vacuum suction unit 108. The display device module 1 may be transferred from the first stage to the second stage by horizontal and rotational movements of the transferring unit 100. A holding pressure by the plate 104 and the jaw 102 may be determined considering a stress and a grip force pressed to the display device module 1.

A receiving portion of the lower receiving container 5 may be opened without combining the lower receiving container 5 and the upper receiving container 7. For example, the lower receiving container 5 receiving the backlight unit 60 may be transferred without combination of the display panel 3. In an exemplary embodiment, the display device module 1 is transferred while the open part of the lower receiving container 5 is upwardly positioned and is inclined so that the display device module 1 is transferred by the gripper G with receiving the backlight unit 60 and the display panel 3.

In an exemplary embodiment, a display device module with the recesses may be transferred.

Figure 9:
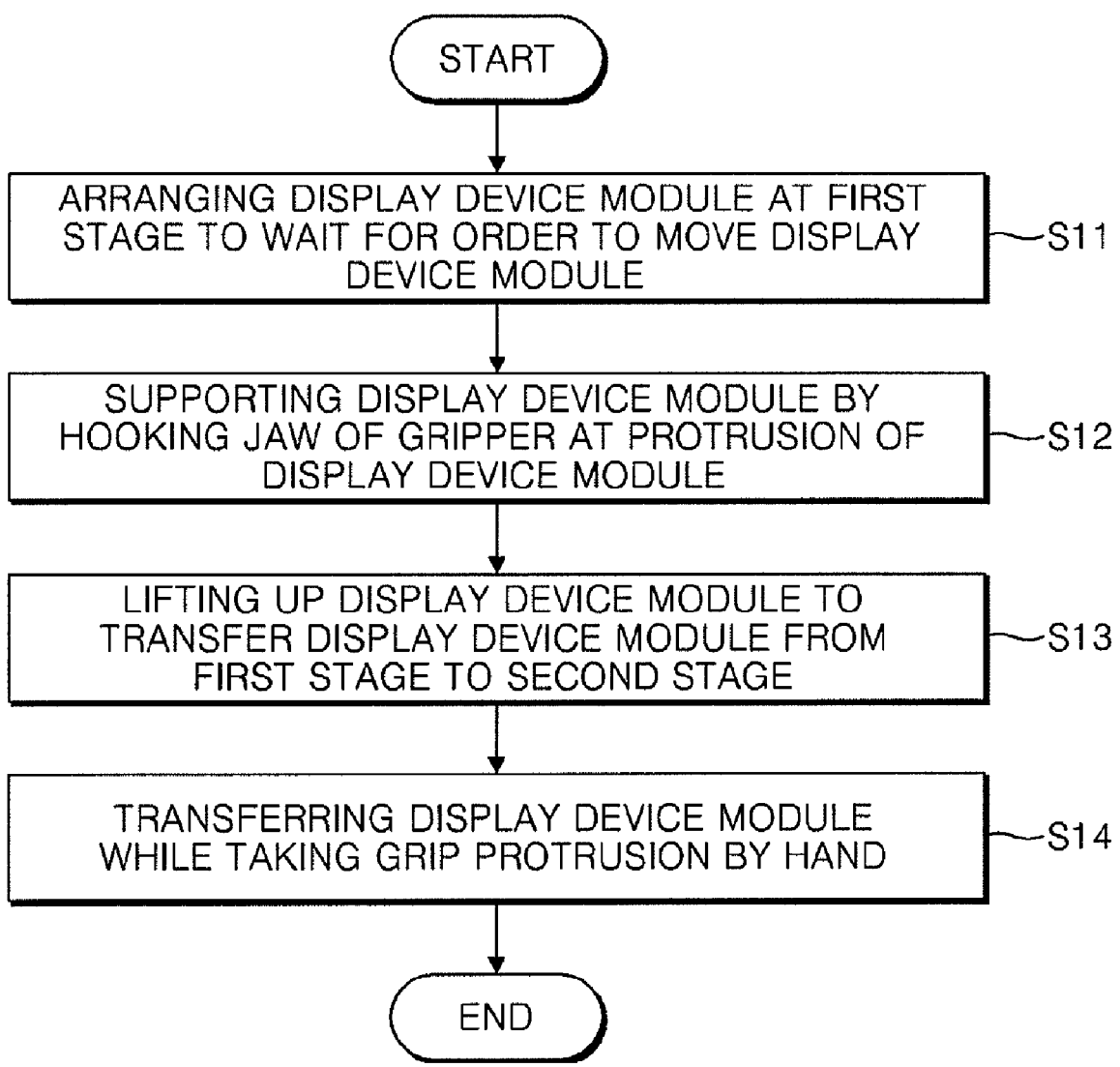
FIG. 9 is a flow chart showing a method of handling a display device module according to an exemplary embodiment of the present invention.

FIG. 9 is a flow chart showing a method of handling a display device according to an exemplary embodiment of the present invention.

Referring FIG. 9, a method includes transferring the display device module 1 using the gripper G of the transferring unit 100 like the embodiment of the FIG. 8 (steps of S11 to S13).

The display device module 1 may be transferred by the manual processes. In an exemplary embodiment, the user can transfer the display device module 1 to a desired place while taking the grip protrusion 4 protruded from the lower receiving container 5 of the display device module 1 by the hand (step of S14).

According to an exemplary embodiment of the present invention, since the grip protrusion where the jaw of the gripper is hooked is formed at the receiving container of the display device module, the display device module is transferred by the gripper.

Since the grip protrusion is formed at the receiving container of the display device module, the width of the bezel can be reduced.

Since the grip protrusion has an uneven portion, the display device module can be handled by the manual processes as well as the automated processes.

Although the illustrative embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A display device module comprising:
   a display panel having a front side and a rear side;
   a first receiving container having a first side and a second side, the first side receiving the front side of the display panel; and
   a grip protrusion formed on the second side of the first receiving container for engaging a jaw of a gripper.

2. The display device module of claim 1, wherein the gripper is installed at a transferring unit to grip and move the first receiving container erectly.

3. The display device module of claim 1, further comprising a second receiving container combining the first receiving container.

4. The display device module of claim 3, wherein the grip protrusion is protruded from the second side of the first receiving container.

5. The display device module of claim 4, further comprising a plurality of grip protrusion sets formed at one of the upper portion and lower portion of the second side of the first receiving container; and
wherein each of the grip protrusion sets comprises a plurality of grip protrusions, and the jaw is engaged with at least one of the grip protrusion sets.

6. The display device module of claim 4, wherein a plurality of grip protrusion are arranged continuously in a row on the second side of the first receiving container.

7. The display device module of claim 4, wherein the grip protrusion is formed across substantially all or all of a width of the second side of the first receiving container.

8. The display device module of claim 1, wherein the grip protrusion is formed by bending a portion of the second side of the first receiving container.

9. The display device module of claim 1, wherein a lower portion of the grip protrusion is open.

10. The display device module of claim 1, wherein the grip protrusion is angled with respect to the second side of the first receiving container.

11. The display device module of claim 1, further comprising a grip block coupled to the second side of the first receiving container by a connection member, the grip block comprising a guide hole and a first connection hole.

12. The display device module of claim 11, further comprising a guider and a second connection hole formed on the second side of the first receiving container, wherein the guide hole receives the guider to line up the first connection hole, the first and second connection holes receiving the connection member to fix the grip block to the first receiving container.

13. The display device module of claim 12, wherein the grip block comprises an uneven portion at a lower portion thereof.

14. A method of handling a display device module comprising:
engaging the display device module using a jaw of a gripper, wherein the jaw engages a grip protrusion formed on an outer surface of a receiving container receiving a display panel of the display device module; and
lifting the display device module; and
transporting the display device module.

15. The method of claim 14, wherein the gripper further comprises a plate formed opposite the jaw, and the method further comprises supporting the display device module at surface opposite the outer surface of the receiving container by using the plate.

16. The method of claim 15, wherein the gripper further comprises a vacuum suction unit, and the method further comprises supporting the display device module using the vacuum suction unit.

17. The method of claim 14, further comprising transporting the display device module by grabbing the grip protrusion with a hand of a user.

* * * * *